US012245429B2

(12) United States Patent
Petti

(10) Patent No.: US 12,245,429 B2
(45) Date of Patent: Mar. 4, 2025

(54) QUASI-VOLATILE MEMORY WITH REFERENCE BIT LINE STRUCTURE

(71) Applicant: SUNRISE MEMORY CORPORATION, San Jose, CA (US)

(72) Inventor: Christopher J. Petti, Mountain View, CA (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 580 days.

(21) Appl. No.: 17/576,416

(22) Filed: Jan. 14, 2022

(65) Prior Publication Data

US 2022/0238551 A1 Jul. 28, 2022

Related U.S. Application Data

(60) Provisional application No. 63/142,144, filed on Jan. 27, 2021.

(51) Int. Cl.

| H10B 43/27 | (2023.01) |
| G11C 11/22 | (2006.01) |
| G11C 16/26 | (2006.01) |
| H10B 43/40 | (2023.01) |
| H10B 51/20 | (2023.01) |
| H10B 51/40 | (2023.01) |

(52) U.S. Cl.
CPC .......... *H10B 43/27* (2023.02); *G11C 11/2273* (2013.01); *G11C 16/26* (2013.01); *H10B 43/40* (2023.02); *H10B 51/20* (2023.02); *H10B 51/40* (2023.02)

(58) Field of Classification Search
CPC ........ H10B 43/27; H10B 43/40; H10B 51/20; H10B 51/40; H10B 41/27; H10B 41/40; G11C 11/2273; G11C 16/26; G11C 11/223; G11C 7/227; G11C 16/28; G11C 16/0466

See application file for complete search history.

(56) References Cited

U.S. PATENT DOCUMENTS 6,894,922 B1 5/2005 Hidaka
9,412,752 B1* 8/2016 Yeh .................. H01L 29/40117
(Continued)

OTHER PUBLICATIONS

"Japanese Patent Application No. 2021-10812", in the name of Sunrise Memory Corporation, filed Jan. 27, 2021.
(Continued)

*Primary Examiner* — Kyoung Lee
*Assistant Examiner* — Sophia W Kao

(57) ABSTRACT

A semiconductor memory device is implemented as strings of storage transistors, where the storage transistors in each string have drain terminals connected to a bit line and gate terminals connected to respective word lines. In some embodiments, the semiconductor memory device includes a reference bit line structure to provide a reference bit line signal for read operation. The reference bit line structure configures word line connections to provide a reference bit line to be used with a storage transistor being selected for read access. The reference bit line structure provides a reference bit line having the same electrical characteristics as an active bit line and is configured so that no storage transistors are selected when a word line is activated to access a selected storage transistor associated with the active bit line.

23 Claims, 9 Drawing Sheets

(56) References Cited

U.S. PATENT DOCUMENTS

| | | |
|---|---|---|
| 10,121,553 B2 | 11/2018 | Harari et al. |
| 2007/0165459 A1 | 7/2007 | Nazarian |
| 2007/0165469 A1 | 7/2007 | Rehm et al. |
| 2008/0205140 A1* | 8/2008 | Lee .................. G11C 16/24 438/257 |
| 2019/0325945 A1* | 10/2019 | Lu .................. G11C 11/419 |
| 2019/0325946 A1 | 10/2019 | Lu |
| 2020/0365609 A1 | 11/2020 | Harari et al. |

OTHER PUBLICATIONS

"PCT Search Report and Written Opinion, PCT/US2022/012521", Apr. 11, 2022, 14 pages.

Office Action and Search Report for corresponding Taiwan Patent Application No. 111101876, issued Oct. 13, 2023, 5 pages.

* cited by examiner

QUASI-VOLATILE MEMORY WITH REFERENCE BIT LINE STRUCTURE

CROSS REFERENCE TO RELATED APPLICATIONS

This application claims priority to U.S. Provisional Patent Application No. 63/142,144, entitled "Quasi-Volatile Memory With Reference Bit-Line Structure," filed Jan. 27, 2021, which is incorporated herein by reference for all purposes.

FIELD OF THE INVENTION

The present invention relates to semiconductor memory circuits and methods. More specifically, the present invention relates to semiconductor memory integrated circuits with reference bit line structure.

BACKGROUND OF THE INVENTION

U.S. Pat. No. 10,121,553 (the '553 patent), entitled "Capacitive-Coupled Non-Volatile Thin-film Transistor NOR Strings in Three-Dimensional Arrays," filed on Aug. 26, 2016, and issued on Nov. 6, 2018, discloses storage or memory transistors organized as 3-dimensional arrays of NOR memory strings formed above a planar surface of a semiconductor substrate. In the '553 patent, a NOR memory string includes numerous thin-film storage transistors that share a common bit line and a common source line. In one implementation, storage transistors in a NOR memory string are arranged along a direction (a "horizontal direction") that is substantially parallel to the planar surface of the semiconductor substrate. In such a 3-dimensional array, the NOR memory strings are provided on multiple planes (e.g., 8 or 16 planes) above the semiconductor substrate, with the NOR memory strings on each plane arranged in rows and one or more columns along two orthogonal horizontal directions. Data is stored in a charge-trapping layer (e.g., a silicon oxide-silicon nitride-silicon oxide triple layer) in each storage transistor. The '553 patent is hereby incorporated by reference in its entirety for all purposes.

In the '553 patent, each storage transistor of a NOR memory string is read, programmed, or erased by suitably biasing its associated word line and the common bit line it shares with other storage transistors in the NOR memory string. The storage transistor's associated word line is shared with storage transistors of NOR memory strings on other planes that are aligned with the storage transistor along the direction normal to the planar surface of the semiconductor substrate ("vertical direction"). Each word line may also be shared between two or more storage transistors from adjacent or nearby NOR memory strings on the same plane. During read, programming or erase operations, the common source line of the NOR memory string is typically provided a relatively constant voltage that is maintained either by a voltage source or by the charge in an associated capacitor ("virtual ground"), such as the parasitic capacitance of the common source line. To program or erase the storage transistor, for example, a substantial voltage difference (e.g., 8 volts) is imposed across the common bit line and the word line.

Various aspects of the read, program or erase operation of the NOR memory string can be optimized to enhance the performance of the NOR memory string.

SUMMARY OF THE INVENTION

In some embodiments, a memory device including an array of storage transistors including multiple strings of storage transistors arranged in parallel in a first direction with storage transistors formed along a second direction normal to the first direction, the storage transistors in each string including drain terminals connected to a bit line and gate terminals connected to a set of word lines. The array of storage transistors includes a first section of strings of storage transistors for storing data, and a first string of storage transistors as a first reference string and a second string of storage transistors as a second reference string. The set of word lines includes a first group of word lines and a second group of word lines, and the storage transistors in each string in the first section have gate terminals that are connected alternately to a word line in the first group and a word line in the second group. The storage transistors in the first reference string have gate terminals connected to word lines in the first group and the storage transistors in the second reference string have gate terminals connected to word lines in the second group. The first reference string provides a first reference bit line signal for reading stored data from the storage transistors in the first section that are connected to word lines in the second group and the second reference string provides a second reference bit line signal for reading stored data from the storage transistors in the first section that are connected to word lines in the first group.

These and other advantages, aspects and novel features of the present disclosure, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 3(a) is a perspective view of a portion of a 3-D NOR memory array and a unit cell body in embodiments of the present disclosure.

FIG. 5(a), is a cross-sectional view of a 3-D NOR memory array in the X-Y plane illustrating the bit line and word line structure in some embodiments.

DETAILED DESCRIPTION OF THE INVENTION

Figure 1:
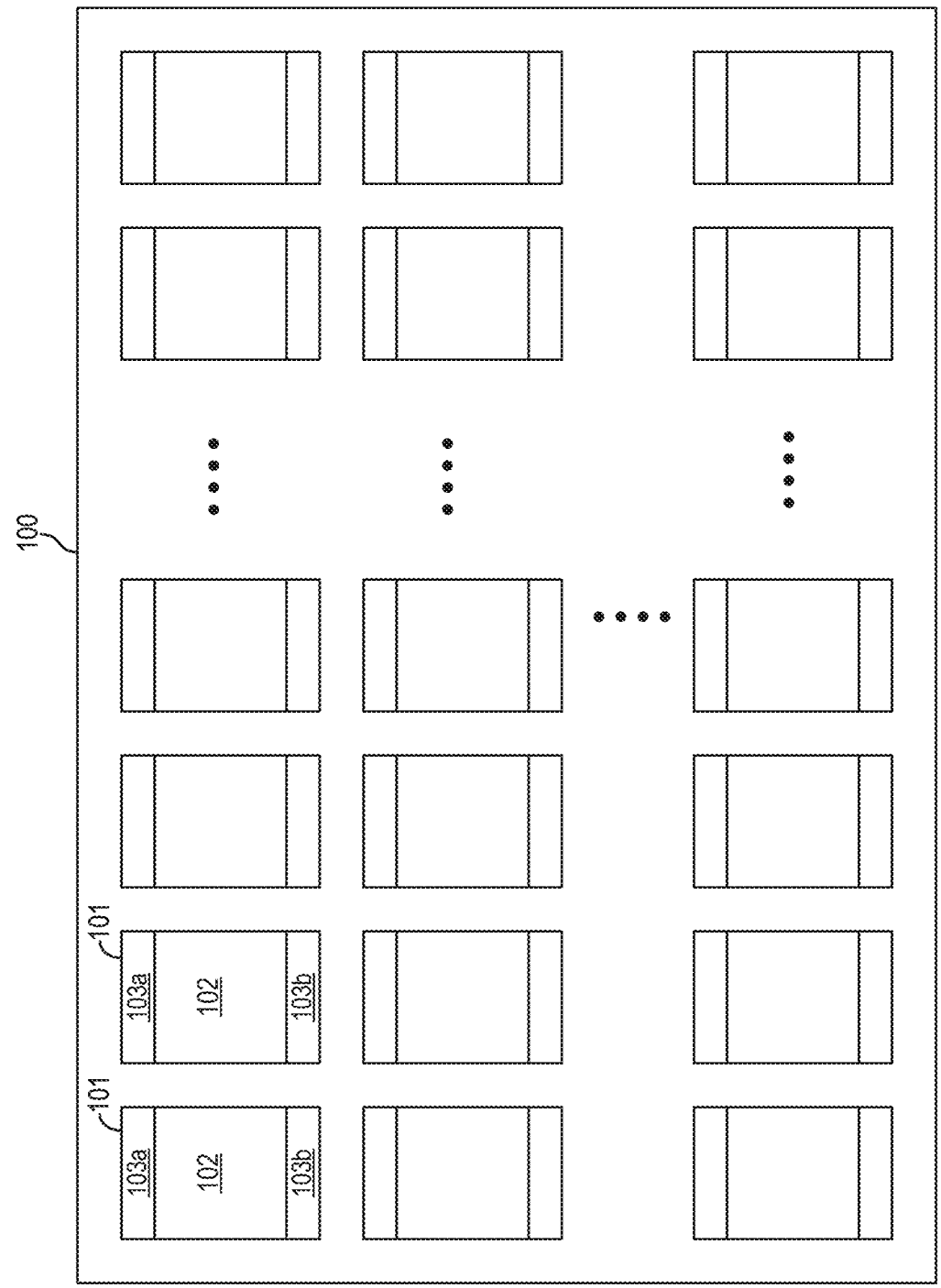
FIG. 1 is a schematic top view of a semiconductor memory device according to embodiments of the present disclosure.

In embodiments of the present disclosure, a semiconductor memory device is implemented as strings of storage transistors, where storage transistors in each string have drain terminals connected to a bit line and gate terminals connected to respective word lines. The semiconductor memory device includes a reference bit line structure to provide a reference bit line signal for read operation. More specifically, the reference bit line structure configures the word line connections to provide a reference bit line to be used with a storage transistor being selected for read access. In particular, the reference bit line has the same electrical characteristics as the active bit line and is configured so that no storage transistors on the reference bit line are selected or activated when a word line is activated to access the selected storage transistor associated with the active bit line.

In some embodiments, the reference bit line signal is coupled to a reference sense amplifier to generate a read reference signal, which can be used as a latch signal to latch the data being read out from an active bit line. In one example, during read operation, a storage transistor is selected for access by activating a word line and an active bit line associated with the selected storage transistor. The active bit line is coupled to a sense amplifier to generate a sense amplifier output signal. In one embodiment, the read reference signal, generated from the reference bit line signal, is used to latch the sense amplifier output signal where the latched sense amplifier output signal is provided as the read data for the selected storage transistor.

In one embodiment, the reference bit line structure includes a first reference bit line and a second reference bit line disposed in a memory array including a set of active bit lines. The memory array includes a first set of word lines connecting to a first set of storage transistors formed along the active bit lines and a second set of word lines connecting to a second set of storage transistors formed along the active bit lines. Meanwhile, the reference bit line structure includes the first and second reference bit lines having the first and second sets of storage transistors formed thereon. The reference bit line structure configures the word lines connections so that when a word line in the first set of word lines is selected, the word line selects a storage transistor in the first reference bit line but does not select any storage transistors in the second reference bit line. Accordingly, the second reference bit line can be used to generate the reference bit line signal. Alternately, the reference bit line structure configures the word lines connections so that when a word line in the second set of word line is selected, the word line selects a storage transistor in the second reference bit line but does not select any storage transistors in the first reference bit line. Accordingly, the first reference bit line can be used to generate the reference bit line signal.

In embodiments of the present disclosure, the semiconductor memory device is constructed using three-dimensional arrays of NOR memory strings formed over a semiconductor substrate, as described in the aforementioned '553 patent. In the present description, the semiconductor memory device includes a memory array of quasi-volatile storage transistors and is sometimes referred to as a "quasi-volatile memory."

FIG. 1 is a schematic top view of a semiconductor memory device according to embodiments of the present disclosure. Referring to FIG. 1, a semiconductor memory device 1 includes memory arrays of thin-film storage transistors where the memory arrays are organized as a 2-dimensional array of modular units 101, referred herein to as "tiles", formed above a planar semiconductor substrate 100. That is, the tiles 101 are arranged in rows and columns on an X-Y plane being the planar surface of the semiconductor substrate 100. In some embodiments, the semiconductor substrate 100 can be a monocrystalline epitaxial layer of a silicon wafer. In this detailed description, to facilitate visualization of the 3-dimensional structures, a rectilinear coordinate reference frame is used, which postulates the planar surface on the X-Y plane, and a normal of the planar surface in the Z-direction orthogonal to the X-Y plane.

In the semiconductor memory device 1, each modular unit ("tile") 101 in the memory structure includes a three-dimensional array of NOR memory strings formed over the semiconductor substrate 100, which can be constructed as described in the aforementioned '553 patent. In the present description, a three-dimensional array of NOR memory strings is sometimes referred to as a "3-D NOR memory array." As thus configured, each tile 101 can be configured to be individually and independently addressed or larger memory segments (e.g., a row of tiles or a 2-dimensional block of tiles) may be created and configured to be addressed together.

In some examples, the semiconductor substrate 100 may include support circuitry for the 3-D NOR memory arrays formed therein or thereon underneath the 3-D NOR memory arrays. Such support circuits may include both analog and digital circuits. Some examples of such support circuits include shift registers, latches, sense amplifiers, reference cells, power supply lines, bias and reference voltage generators, inverters, NAND, NOR, Exclusive-OR and other logic gates, input/output drivers, address decoders (e.g., bit line and word line decoders), other memory elements, data encoding and decoding circuits including, for example, error detection and correction circuits, sequencers and state machines. This detailed description begins with a semiconductor substrate in which such support circuits, if any, have already been formed in a conventional manner. This detailed description and the skill of those of ordinary skill in the art inform any constraints or relevant design options imposed or made available by the process or processes carried out in the formation of the support circuits of the semiconductor substrate in the various embodiments of the present disclosure.

As shown in FIG. 1, a tile 101 includes an "array" portion 102, which is provided between "staircase portions" 103a and 103b. The thin-film storage transistors of the NOR memory strings in tile 101 are formed in the array portion 102. Connections through conductive vias to common bit lines and, optionally, common source lines, of the NOR memory strings are provided in the staircase portions 103a and 103b. In some embodiments, the common source lines are provided with a relatively constant voltage to serve as a virtual voltage reference during programming, erase and read operations, thereby obviating the need for a continuous electrical connection with the support circuitry during such operations. In FIG. 1, the array portion 102 and the staircase portions 103a and 103b are not drawn to scale. For example, the array portion 102 may be much larger in area than either of staircase portions 103a and 103b.

Figure 2:
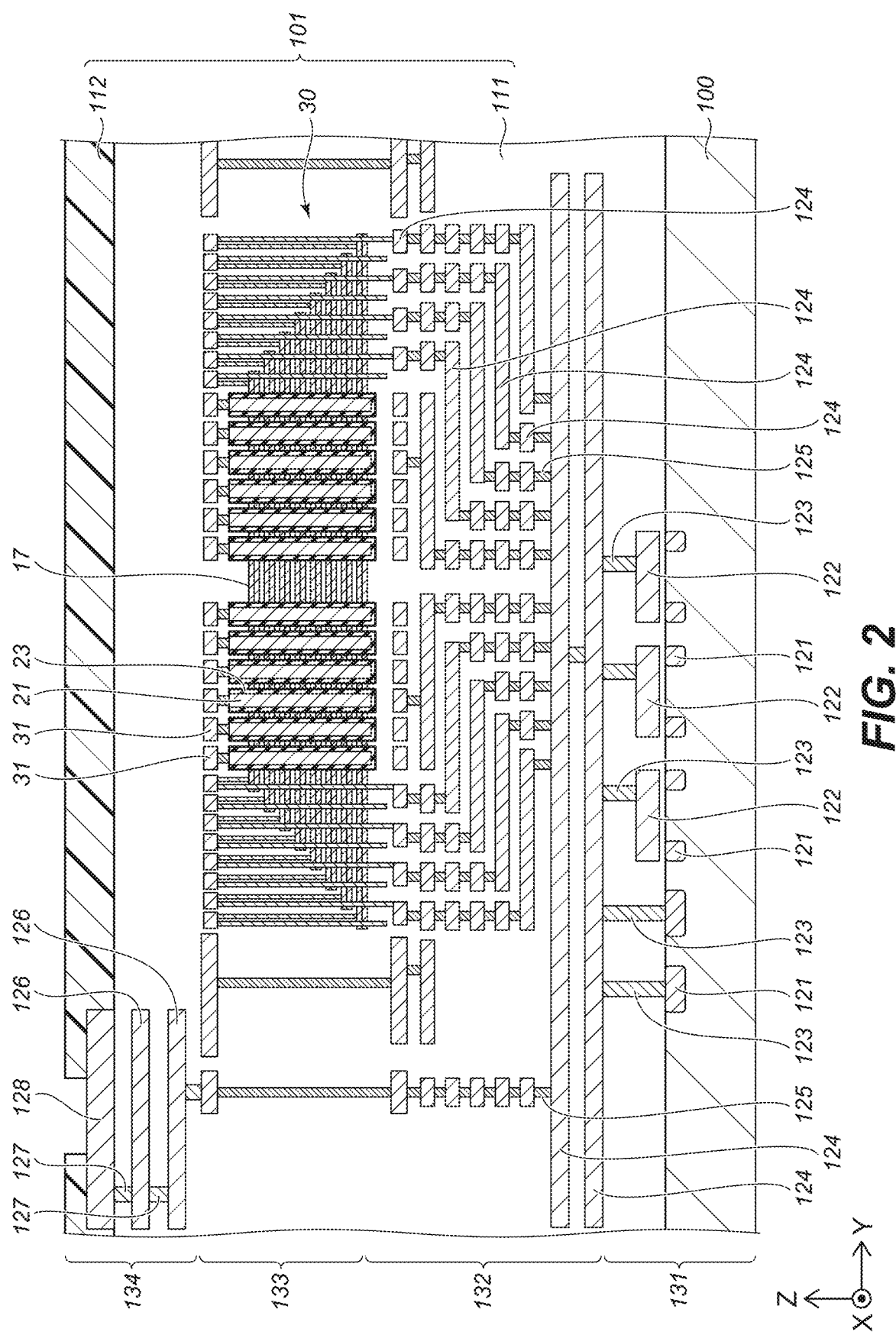
FIG. 2 illustrates a cross-sectional view of a tile in the semiconductor memory device of FIG. 1 in the Y-Z plane in embodiments of the present disclosure.

FIG. 2 illustrates a cross-sectional view of a tile in the semiconductor memory device of FIG. 1 in the Y-Z plane in embodiments of the present disclosure. Referring to FIG. 2, a tile 101 is formed on the semiconductor substrate 100. The memory structure of the tile 101 is formed in an inter-layer insulating film 111 with a passivation film 112 formed thereon. In some embodiments, the inter-layer insulating film 111 is formed of silicon oxide ($SiO_x$) and the passivation film 112 is formed of polyimide.

P-type or N-type diffusion regions 121 are formed in the upper surface of the semiconductor substrate 100. Other structures (not shown in FIG. 2), such as isolation structures or shallow trench isolation (STI) structures, may also be formed in the semiconductor substrate 100. Gate electrodes 122 are formed on and insulated from the semiconductor substrate 100 by a gate dielectric layer. For example, the gate dielectric layer may be a thin silicon oxide layer. The gate electrodes 122 together with the P-type and N-type diffusion regions 121 form transistors in the semiconductor substrate 100, where the transistors can be used to form circuit elements. For example, the transistors can be used to form the support circuitry for the 3-D NOR memory arrays in a circuit element formation layer 131. The circuit elements are interconnected to form the support circuitry by contacts 123 connecting to one or more layers of interconnects 124 and vias 125 formed in the inter-layer insulating film 111 in a lower interconnect layer 132. In some embodiments, the support circuitry of the semiconductor memory device 10 is formed in the circuit element formation layer 131 and the lower interconnect layer 132.

In the tile 101, the 3-D NOR memory array is formed in a memory array portion 133. An upper interconnect layer 134 is formed on the memory array portion 133. Interconnects 126 and vias 127 are provided in the inter-layer insulating film 111 in the upper interconnect layer 134 for forming additional electrical connections. In some embodiments, a conductive pad 128 is provided in the upper interconnect layer 134 for connecting to circuit elements external to the semiconductor memory device 1. For instance, the passivation film 112 is formed on and encapsulates the upper interconnect layer 134 with an opening exposing at least a part of the conductive pad 128.

In the above-described embodiments, the supporting circuitry is described as being formed under the memory array portion 133. Such configuration is illustrative only and not intended to be limiting. For example, in other embodiments, both the memory array portion and the supporting circuitry may be directly formed on the semiconductor substrate 100. In such a case, for example, the supporting circuitry may be located at the periphery of the memory array portion. In other embodiments, the supporting circuitry may be formed on another semiconductor substrate. In such a case, for example, the semiconductor substrate in which the memory array portion is formed and the semiconductor substrate in which the supporting circuitry is formed are bonded after formation of the respective memory and circuit elements.

Figure 3:
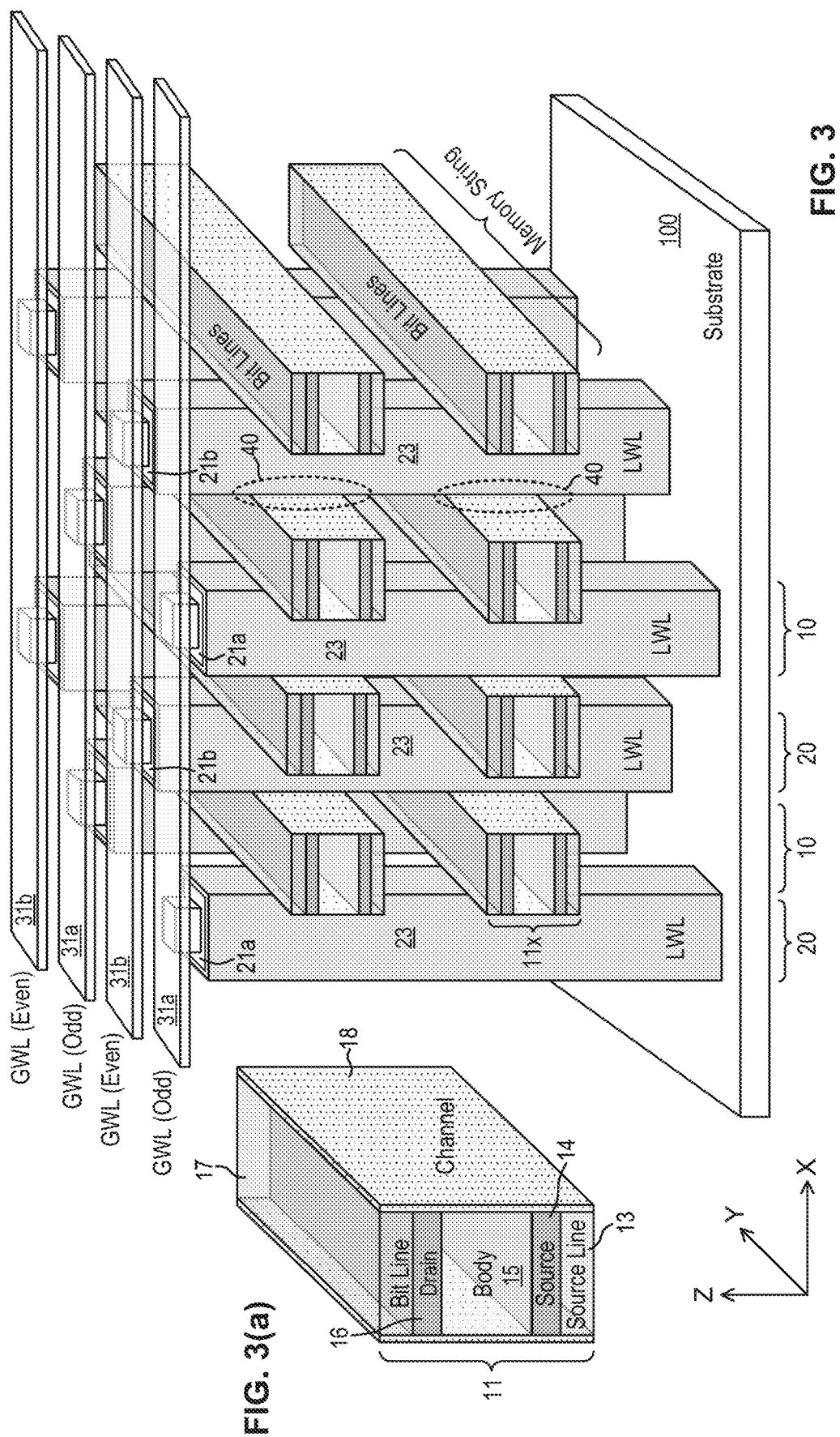
FIG. 3, which includes

The structure of the 3-D NOR memory array will now be described with reference to FIGS. 2 and 3. FIG. 3, which includes FIG. 3(a), is a perspective view of a portion of a 3-D NOR memory array and a unit cell body in embodiments of the present disclosure. Referring to FIGS. 2 and 3, in the tile 101, the 3-D NOR memory array includes a three-dimensional array of strings of storage transistors ("memory strings") formed above the semiconductor substrate 100. As shown in FIG. 3, the memory strings may be arranged as a two-dimensional array on the X-Z plane. That is, multiple memory strings may be arranged in the X-direction to form a memory cell layer, with the storage transistors of each memory string extending in the Y direction. Multiple memory cell layers are stacked in the Z-direction to form a two-dimensional array of memory strings in the X-Z plane. Although not shown in FIG. 3, the memory strings are isolated from each other in the Z direction by an insulating layer 12. As thus configured, storage transistors are arranged to form a three-dimensional memory array. In the present description, the three-dimensional array of storage transistors is referred to as a memory structure body 30.

Each string of storage transistors shares a common drain layer 16 and a common source layer 14 extending in a first direction (Y-direction). The drain layer 16 is coupled and connected to a conductive layer forming the bit line 17. The source layer 14 is coupled to and connected to a conductive layer forming the source line 13. The drain layer 16 and the source layer 14 are in contact with and spaced apart by a body region 15, thereby forming a unit cell structure 11. A channel layer 18 is formed on the two side surfaces of the unit cell structure 11, i.e., on the two sides of the unit cell structure 11 in the X-direction. The channel layer 18 are in contact with the source line 13, the source layer 14, the body 15, the drain layer 16, and the bit line 17. The unit cell structure 11, which can be used to form a string of storage transistors, is isolated from another unit cell structure 11 in the Z-direction by the insulating layer 12 (omitted in FIGS. 2 and 3). In embodiments of the present disclosure, a stack of unit cell structures 11 interleaved with the insulating layer 12 in the Z-direction is referred to as a source-drain structure body 10.

In some embodiments, the insulating layer 12 is made of an insulating material, such as silicon oxycarbide (SiOC). The body region 15 may be formed by an insulating layer, such as silicon oxide ($SiO_x$). In some embodiments, the source layer 14 and the drain layer 16 are semiconductor layers and are made of n+-type amorphous silicon (aSi) in some examples. In some embodiments, the source line 13 and the bit line 17 are made of a conductive material, usually a metal layer. In one embodiment, the source line 13 and the bit line 17 are formed using a refractory metal layer with a metal liner formed thereon. The refractory metal layer may include a layer of tungsten (W), tungsten nitride (WN), molybdenum (Mo), or titanium-tungsten alloy (TiW). The metal liner layer may include a layer of titanium (Ti), titanium nitride (TiN), tantalum (Ta) or tantalum nitride (TaN). In some embodiments, the channel layer 18 is a semiconductor layer and is made of p+-type amorphous silicon in some examples.

The memory strings in the 3-D memory array are separated from each other in the X-direction by a gate structure body 20 including local word lines 21 arranged in the Y-direction. Each local word line 21 is a column structure extending in the Z-direction. Although not shown in FIG. 3, the local word lines 21 are isolated from each other in the Y direction by an insulating layer 22. In the present description, the local word lines interleaved with the insulating layer in the X-direction is referred to as a gate structure body 20. As thus configured, the memory structure body 30 (or memory array) includes alternating regions of the gate structure body 20 and the source-drain structure body 10 in the X-direction.

In some embodiments, the local word line 21 is a conductive layer, such as a metal layer. In one embodiment, the local word line 21 is formed using a refractory metal layer with a metal liner formed thereon. The refractory metal layer may include a layer of tungsten (W), tungsten nitride (WN), molybdenum (Mo), or titanium-tungsten alloy (TiW). The metal liner layer may include a layer of titanium (Ti), titanium nitride (TiN), tantalum (Ta) or tantalum nitride (TaN). In some embodiments, the insulating layer 22 is made of an insulating material, such as silicon oxide ($SiO_x$).

In embodiments of the present disclosure, a charge storage film 23 is formed on the side surface of the local word line 21. In particular, the charge storage film 23 is formed at least between the source-drain structure body and each of the local word lines 21. In some embodiments, the charge storage film 23 may include a tunneling layer, a charge storage layer and a blocking layer. The tunneling layer may be any silicon oxide ($SiO_x$), silicon nitride ($Si_xN_y$), silicon oxynitride (SiON), any aluminum oxide ($AlO_x$), any hafnium oxide ($HfO_x$), zirconium oxide ($ZrO_x$), any hafnium silicon oxide ($HfSi_xO_y$), any hafnium zirconium oxide (HfZrO), or any combination thereof. The charge storage layer may be any silicon nitride ($Si_xN_y$), hafnium oxide ($HfO_2$), or hafnium silicon oxynitride (HfSiON)). The blocking layer may be any silicon oxide, aluminum oxide, or both. In the present description, a local word line 21 with the charge storage film 23 formed there on is sometimes referred to as a local word line structure.

As thus configured, the storage transistors (memory cells) 40 are provided on one or both sides of the unit cell structure 11 along the length of the memory string (Y-direction) and at the intersections with the local word lines structures. That is, as shown in FIG. 3, a storage transistor 40 is formed at the intersection of a unit cell structure 11 extending in the Y-direction and a local word line structure extending in the Z-direction. The storage transistor 40 is formed by the local word line 21 as the gate, the charge storage film 23 interposed between the gate and the channel layer 18 as the charge trapping layer, and the source layer and drain layer being formed on opposite sides of the channel layer 18 as the source and drain of the storage transistor. The bit line 17 connects the drain layer of all the storage transistors along the memory string. The source line 13 connects to the source layer of all the storage transistors along the memory string.

As described above, storage transistors 40 can be formed on both sides of the unit cell structure 11. In the present embodiments, the local word line structures in adjacent gate structure bodies 20 are staggered or offset so that storage transistors 40 are not formed directly opposite each other on the unit cell structure 11 in the X-direction. More specifically, for each memory string (unit cell structure 11), each local word line structure arranged on one side of the memory string is staggered or offset in the Y-direction from the local word line structure arranged on the opposite side of the memory string. In this manner, the storage transistors 40 formed on one side of the unit cell structure 11 is positioned offset in the Y-direction from an adjacent storage transistor formed on the other side of the unit cell structure.

In the semiconductor memory device 1, each storage transistor 40 is accessed by an activated word line selected by a word line signal. In the 3-D memory array, the word line signal activates a global word line 31 and one or more local word line 21 connected to the selected global word line. In the present description, the word line for a storage transistor 40 includes the global word line 31 and the local word line 21 connected thereto. In the 3-D memory array, each word line may be shared by numerous storage transistors in different NOR memory strings along the length of the memory strings. Each word line may also be shared by storage transistors formed on opposite sides of the local word line.

In the semiconductor memory device 1, the storage transistors 40 in the memory array 30 are accessed by global word lines 31 that are provided above the memory array 30 and extend in the X-direction across the strings of storage transistors. Local word lines 21 extend in the Z-direction to connect the global word lines 31 to the storage transistors across the multiple planes of NOR memory strings formed by the unit cell structure 11. In the embodiment shown in FIG. 3, the global word lines 31 includes a first group of global word lines 31a, also referred to as the odd global word lines (Odd GWL), and a second group of global word lines 31b, also referred to as the even global word lines (Even GWL). The odd global word lines 31a and the even global word lines 31b are alternately arranged in the Y direction. Local word lines 21 in each gate structure body 20 are arranged to connect to one group of global word lines. For instance, the local word lines 21a in a gate structure body 20 are arranged to connect to the odd global word line 31a while the local word lines 21b in another gate structure body 20 are arranged to connect to the even global word line 31b. In some embodiments, the global word lines 31 are formed of a conductive layer, such as a metal layer. In one example, the global word lines 31 are formed using a copper layer.

For example, a first Odd GWL 31a connects to a first set of local word lines 21a in the X-Z plane and in every other gate structure body 20. A first even GWL 31b connects to a first set of local word lines 21b in the X-Z plane and in every other gate structure body 20. The local word lines 21a and the local word lines 21b are positioned offset from each other in the Y-direction. A second Odd GWL 31a connects to a second set of local word lines 21a in the X-Z plane and in every other gate structure body 20. A second even GWL 31b connects to a second set of local word lines 21b in the X-Z plane and in every other gate structure body 20.

As thus configured, adjacent local word lines 21 along the same side of a memory string are connected to the global word lines 31 of the same group while adjacent local word lines 21 formed on opposing sides of a memory string are connected to global word lines 31 of different groups. That is, for a memory string 11x, the local word lines 21 formed on the same side of the memory string 11x are connected to global word lines 31 of the same group. For example, local word lines 21a on one side of the memory string 11x are connected to respective odd global word lines 31a. Meanwhile, a local word line 21a formed on one side of the memory string 11x and a local word line 21b formed on the opposite side of the memory string 11x are connected to global word lines 31 of different groups. For example, a local word line 21a on one side of the memory string 11x is connected to the Odd GWL 31a while a local word line 21b on the opposite side of the memory string 11x is connected to the Even GWL 31b.

To select a storage transistor, a global word line (e.g., word line 31a) is activated. The local word lines 21a associated with the global word line 31a are activated to select a storage transistor 40 associated with the local word lines 21a that are electrically connected to the global word line 31a. The memory cell 40 has different threshold voltages according to whether or not a charge is stored in the charge storage layer in the charge storage film 23. Therefore, information can be stored by the charge entering and exiting the charge storage layer. In some embodiment, the portion of the charge storage film 23 in which the charge is stored is a silicon nitride layer, but the present invention is not limited thereto. For example, the charge storage layer may be formed of a material such as hafnium oxide silicate (HfSiO), zirconium oxide (ZrO), hafnium aluminate (HfAlO), silicon oxynitride (SiON), and other suitable materials.

In the present embodiments, the semiconductor memory device is formed using thin-film storage transistors implementing charge trapping as the data storage mechanism where data is stored in a charge storage film in each storage transistor. An applied electrical field across the charge storage film adds or removes charge from charge traps in the charge trapping layer of the charge storage film, altering the threshold voltage of the storage transistor to encode a given logical state to the storage transistor. In other embodiments, the semiconductor memory device may be formed using ferroelectric field-effect transistors as the storage transistors. More specifically, a ferroelectric field-effect transistor (referred herein as ferroelectric transistors or FeFETs) is formed by using a ferroelectric material as the gate dielectric layer between the gate conductor and the channel of a field-effect transistor. The ferroelectric transistor realizes memory function by storing data as polarization states in the ferroelectric gate dielectric layer. In particular, a voltage applied to the gate conductor induces electrical polarization in the ferroelectric dielectric layer, which polarization can be reversed with application of a voltage in the opposite polarity. The induced polarization states of the ferroelectric dielectric layer change the threshold voltage of the ferroelectric transistor. The change or shift in the threshold voltage of the ferroelectric transistor due to the different polarization states can be used to represent data in different logical states. For example, two logical states (e.g., "0" and "1") can be represented by the higher and lower threshold voltages of the ferroelectric transistor as a result of two induced electrical polarization states in the ferroelectric dielectric layer.

In other embodiments, a ferroelectric storage transistor is constructed in a similar manner as the charge-trapping storage transistors by replacing the charge storage film with a gate dielectric layer incorporating a ferroelectric material. In some embodiments, the ferroelectric gate dielectric layer is a doped hafnium oxide ($HfO_2$) layer. In one example, the hafnium oxide is doped with zirconium oxide ($ZrO_2$) to form a hafnium zirconium oxide layer (HZO). In another example, the hafnium oxide is doped with silicon (Si), iridium (Ir) and lanthanum (La). In some embodiments, the gate dielectric layer may further include an interfacial layer, such as a material with a high permittivity, between the channel region and the gate dielectric layer. In the case of a ferroelectric storage transistor, the gate conductor is formed as a metal layer, such as a titanium nitride (TiN) layer, in some embodiments.

Returning to FIG. 2, the memory array 30 includes staircase structures at the end portions of the memory array in the Y-direction. For example, the bit lines 17 of the memory string may be extended in the Y-direction to form the staircase structures. Each bit line 17 is connected to a contact at the upper surface of the step. It is instructive to note that it is only necessary for the memory structure body 30 to have a configuration in which each bit line 17 can be connected to the support circuitry and the use of the staircase structures are illustrative only. In other embodiments, other structures for connecting the bit lines 17 to the support circuitry can be used.

Figure 4:
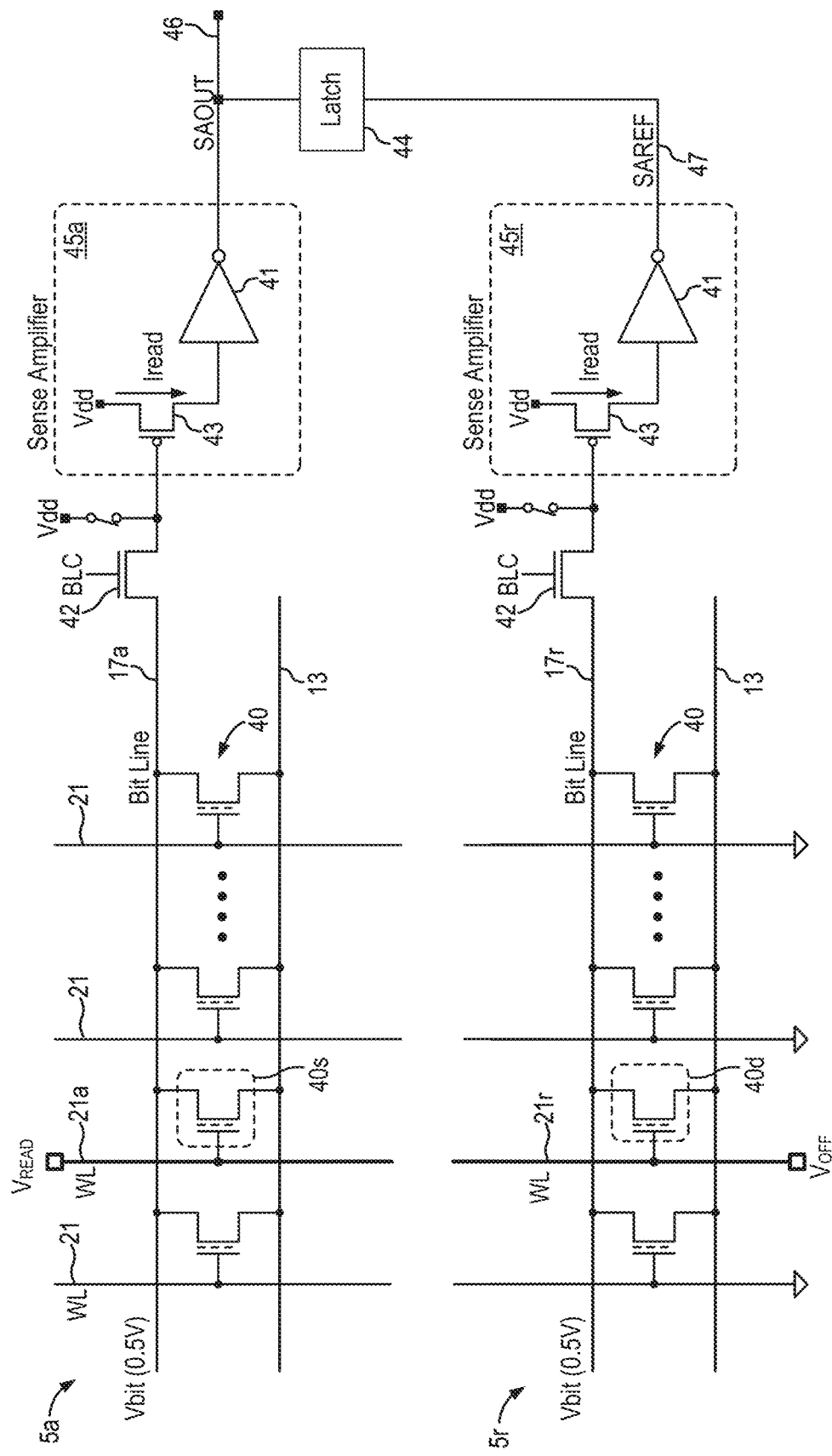
FIG. 4 is a circuit diagram representative of the strings of storage transistors connected to sense amplifiers in embodiments of the present disclosure.

FIG. 4 is a circuit diagram representative of the strings of storage transistors connected to sense amplifiers in embodiments of the present disclosure. Referring to FIG. 4, a string 5 of storage transistors includes multiple thin-film storage transistors 40 that share a common bit line 17 and a common source line 13. Typically, a string of storage transistors includes thousands of the parallelly-connected storage transistors. In embodiments of the present disclosure, the string of storage transistors is referred to as a NOR memory string as the storage transistors are connected in parallel with each other and is described as being arranged in a NOR configuration. The string of storage transistors forms a basic building block from which a two-dimensional or three-dimensional array of storage transistors can be formed. That is, multiple strings of storage transistors can be used to form a two-dimensional array of storage transistors, or a plane of storage transistors. A three-dimensional array of storage transistors can be formed by stacking multiple planes of the two-dimensional array of storage transistors. In the present description, the semiconductor memory device is implemented by an array or arrays of strings of storage transistors and the exact configuration or arrangement of the strings of storage transistors is not critical to the practice of the present invention. For the purpose of the present discussion, FIG. 4 illustrates a string of storage transistors (string 5a) for storing data and a string of storage transistors (string 5r) which is used to generate a read reference signal for reading stored data.

In the present description, the memory array of FIG. 4 includes storage transistors that implement charge trapping as the data storage mechanism. In other embodiments, the storage transistors can implement ferroelectricity as the data storage mechanism. The exact nature of the data storage mechanism being implemented in the memory array is not critical to the practice of the present invention. The biasing conditions applied to the storage transistors for read and write operations are a function of the data storage mechanism being implemented, as is understood by one skilled in the arts. For illustrative purposes, the biasing conditions for charge trapping type storage transistors will be used in the following description.

Referring still to FIG. 4, the storage transistors 40 in a string 5 have drain terminals that are connected to the common bit line 17 which is connected to a sense amplifier 45 through a bias device 42. The storage transistors 40 in the string 5 have source terminals that are connected to a common source line 13. In the present embodiment, the source line 13 is electrically floating, that is, the source line 13 is not connected to any electrical potential. In practice, the source line 13 maintains a relatively constant voltage through the parasitic capacitance at the source terminals, such as the parasitic capacitance between the source terminals and the gate terminals of the storage transistors. In some embodiments, the source line 13 may be biased to a given voltage, such as the ground voltage, and then left floating during memory operations. In the present description, the source line 13 is sometimes referred to as being connect to a virtual ground. In other embodiments, the source line 13 can be provided with a given voltage potential, such as the ground voltage, by a voltage source.

Each storage transistor 40 is a thin film storage transistor including a drain terminal connected to the bit line 17, a source terminal connected to the source line 13, a gate terminal or control terminal connected to a word line 21 and a charge-trapping layer (charge storage layer) in which data is stored for the storage transistor. As thus constructed, each storage transistor 40 has associated parasitic capacitances. More specifically, each storage transistor 40 has parasitic gate-to-drain capacitance Cgd, parasitic gate-to-source capacitance Cgs, and parasitic drain-to-source capacitance Cds. Because the drain terminals of all the storage transistors 40 in the string 5 are connected to the common bit line 17, the parasitic gate-to-drain capacitance Cgd of all of the storage transistors in the string becomes a parasitic capacitance as seen by the bit line 17. In the present description, the parasitic capacitance on bit line 17 is also referred to as the drain parasitic capacitance or the bit line parasitic capacitance. Meanwhile, the source terminals of all the storage transistors 40 in the string 5 are connected to the common source line 13 and the parasitic gate-to-source capacitance Cgs of all of the storage transistors in the string becomes a source parasitic capacitance as seen by the common source line 13.

In the present illustration, the string 5a of storage transistors is associated with an active bit line 17a and the string 5r of storage transistors is associated with a reference bit line 17r. The active bit line 17a is coupled to a sense amplifier 45a and the reference bit line 17r is coupled to a reference sense amplifier 45r.

In operation, one storage transistor (e.g., storage transistor 40s) in the string 5a is selected for access, such as read operation. The word line 17a of the selected storage transistor 40s is driven to a given voltage. For example, for reading from the storage transistor, the word line 21a of the selected storage transistor 40s is driven to a read voltage $V_{READ}$. For example, the read voltage $V_{READ}$ may be 2V. All the other word lines 21 in the string 5 are driven to an off voltage Voff, such as the ground voltage. As a result of the source parasitic capacitance between the source terminals and the non-selected word lines 21, the common source line 13 is biased capacitively to the ground voltage, or to a virtual ground. The selected storage transistor 40s may be a conductive cell or a non-conductive cell. That is, the storage transistor has a threshold voltage that is varied depending on the charge stored in the charge storage layer.

In the present embodiment, a storage transistor is a conductive cell when it is erased. That is, in the erase state, the storage transistor has a threshold voltage lower than the read voltage and the storage transistor conducts current when it is selected. On the other hand, a storage transistor is a non-conductive cell when it is programmed. That is, in the program state, the storage transistor has a threshold voltage higher than the read voltage and the storage transistor does not conduct current when it is selected. When the storage transistor 40s is selected for access, if the cell is programmed, there is no DC current flowing through the drain and source terminals of the selected storage transistor even if the drain and source have different voltages; however, if the cell is erased, thus conducting, there is DC current between drain and source of the selected storage transistor as long as the drain node 17 of the string and source node 13 of the string have different voltages. Eventually, the drain node 17 and the source node 13 will be shorted together by the conducting cell.

In the present embodiment, in order to read the stored data from the storage transistor, bit line current sensing is used. In particular, the bit line is biased to a certain voltage level by the bias device 42. In other words, to read the stored data from the selected storage device, the bit line is charged up to a given voltage Vbit, sometimes referred to as precharging the bit line. In one example, the voltage Vbit is 0.5V. Then the selected storage transistor is allowed to modulate the bit line based on the conductive state of the storage transistor. Because of the parasitic capacitance, in particular the grounded-gate-to-drain capacitance of all of the storage transistors on the string, a displacement current flows in the bit line when the bit line is being pre-charged. As a result, the sense amplifier 45 waits for the bit line to settle first before sensing the read out data.

In the present embodiment, the bias device 42 is coupled to precharge the bit line 17. In particular, the bias device 42 is an NMOS transistor and has a drain terminal switchably connected to a positive power supply voltage Vdd. The bias device 42 has a source terminal connected to the bit line 17. The bias device 42 has a gate terminal or control terminal receiving a bit line control (BLC) voltage. The drain terminal of the bias device 42 also connects to the sense amplifier input node. Accordingly, the bias device 42 connects the bit line 17 to the sense amplifier 45. In the present embodiment, the sense amplifier 45 includes a PMOS transistor 43 as an input device. The gate terminal of PMOS transistor 43 is the sense amplifier input node. The PMOS transistor 43 is connected across the positive power supply voltage Vdd and a buffer 41 to generate the sense amplifier output signal SAOUT (node 46). In the present embodiment, the buffer 41 is an inverting buffer. The sense amplifier output signal SAOUT is inverse of the output of the PMOS transistor 42, but in phase with the sense amplifier input signal on the bit line 17.

In the present description, the bit line circuit and sense amplifier circuit are illustrative only and not intended to be limiting. In particular, the bit line circuit and sense amplifier circuit are illustrated with only the relevant elements so as not to unnecessarily obscured the invention. In actual implementation, the bit line circuit and the sense amplifier circuit may include other circuit elements and other control signals to facilitate the operation of the sense amplifier and the memory circuit. For example, the bit line may include a discharge transistor to discharge the bit line after a read or write operation. In another example, the sense amplifier circuit may include additional transistors and devices to implement sense amplifier reset functions.

In the present embodiment, the sense amplifier circuit further include a latch circuit 44 for latching the output SAOUT of the sense amplifier. In the present description, the buffer 41 is sometimes referred to as a second amplification stage and may be configured with additional circuit elements to form a latch circuit for latching the sense amplifier output signal SAOUT. In operation, the sense amplifier 45 uses a read reference signal to distinguish a conductive memory cell from a non-conductive memory cell. In practice, the read reference signal determines the time the sense amplifier output signal should be latched as the valid output signal. To generate the read reference signal, a string 5r of storage transistors is used as the reference string to generate a reference current on the reference bit line 17r. In operation, the reference bit line 17r is pre-charged just as the active bit line 17a. However, during the read operation, none of the storage transistors on the reference bit line 17r are selected so that only leakage current flows in the reference bit line 17r. The reference sense amplifier 45r senses the leakage current on the reference bit line 17r as the reference bit line signal and provide the sensed current as the read reference signal SAREF (node 47). The read reference signal SAREF is coupled to the latch circuit 44 and used to latch the sense amplifier output signal SAOUT. In response to the read reference signal SAREF being asserted, the latch circuit 44 latches the sense amplifier output signal SAOUT which is indicative of the read data from the selected storage transistor 40s.

To generate the read reference signal accurately, the read reference signal is generated using a string of storage transistors selected from the numerous memory strings in the memory array as the reference string so that the read reference signal accurately duplicates the electrical characteristics of the memory string, such as the parasitic capacitance, the leakage current and other parameters. However, to ensure a consistent and accurate reference bit line signal, no storage transistor on the reference string should be selected or activated during the read operation. Instead, all the storage transistors on the reference string should be unselected, that is, the word lines to the storage transistors on the reference string should be at the off voltage Voff, such as 0V.

In some embodiments, the reference string is formed by thin-film storage transistors implementing charge trapping as the data storage mechanism where data is stored in a charge storage film in each storage transistor. In other embodiments, the reference string is formed by ferroelectric field-effect transistors used as the storage transistors. In all cases, the storage transistors connected to the reference bit lines and the storage transistors connected to all other bit lines should be of the same type. For example, in the case the storage transistors connected to the memory array bit lines are ferroelectric field-effect transistors, the storage transistors connected to the reference bit lines should also be ferroelectric field effect transistors. In another example, in the case the storage transistors connected to the memory array bit lines are charge trapping type field-effect transistors, the storage transistors connected to the reference bit lines should also be charge trapping type field effect transistors.

In the 3-D NOR memory array as described above, the storage transistors are connected to the local word lines and global word lines. Each local word line column connects to multiple storage transistors across multiple planes of strings of storage transistors. The local word lines are connected to respective global word lines, including alternating even global word lines and odd global word lines. Each global word line connects to multiple local word lines in a direction normal to the bit lines of the memory strings.

In embodiments of the present disclosure, the semiconductor memory device of the present disclosure implements a reference bit line structure for providing a reference bit line within the 3-D NOR memory array where the reference bit line is associated with a string of storage transistors (the reference string) in the memory array having no storage transistor being selected when a word line is asserted to access the stored data in a storage transistor. As shown in FIG. 4, the reference bit line structure of the present disclosure provides a reference bit line 17r where the word line portions 21r are not connected to the remaining word line 21 associated with storage transistors along the same plane. The reference bit line structure will be described in more detail below.

Figure 5:
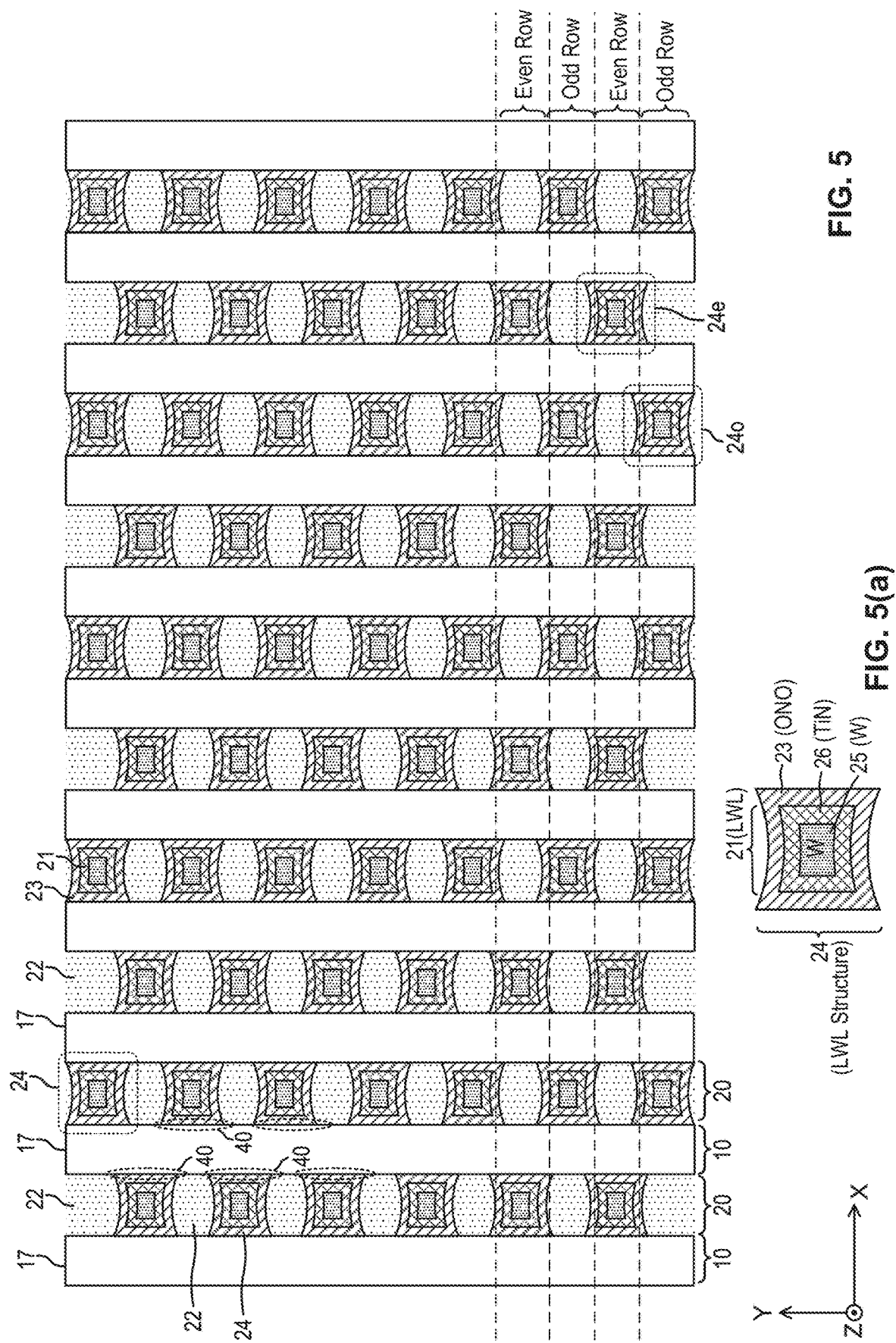
FIG. 5, which includes

FIG. 5, which includes FIG. 5(a), is a cross-sectional view of a 3-D NOR memory array in the X-Y plane illustrating the bit line and word line structure in some embodiments. Referring to FIG. 5, when viewed from the top in the X-Y plane, the 3-D NOR memory array includes alternate source-drain structure bodies 10 and gate structure bodies 20 arranged interleaving in the X-direction. The source-drain structure body 10 includes multiple layers of unit cell structures arranged in the Z-direction, each unit cell structure extending in the Y-direction and isolated from a neighboring unit cell structure in the Z-direction by an insulating layer. The cross-sectional view in FIG. 5 illustrates the bit line 17 formed in the source-drain structure body 10. The gate structure body 20 includes multiple local word line structures 24 arranged in the Y-direction and interleaving with insulating members 22. The local word line structure 24 extends in the Z direction to intersect the multiple layers of unit cell structures to form storage transistors 40 at the intersection thereof.

In the present description, the local word line 21 has the charge storage film 23 formed thereon and the combined structure is referred to as the local word line structure 24. In the present embodiment, the local word line structure 24 includes the local word line 21 formed by a tungsten (W) layer 25 as the inner portion and a titanium nitride (TiN) layer 26 enclosing the tungsten layer 25 in the X-Y plane, as shown in FIG. 5(a). The local word line structure 24 further includes the charge storage film 23 formed on the local word line 21. The charge storage film 23 can be an ONO film (silicon oxide, silicon nitride, and silicon oxide) in some embodiments.

As thus arranged, a storage transistor 40 is formed at the intersection of the unit cell structure, illustrated by the bit line 17, and a local word line structure 24. Storage transistors 40 are formed on both sides of the bit line 17. In embodiments of the present disclosure, the local word line structures 24 on two sides of a bit line 17 are staggered or arranged offset in the Y direction. Accordingly, the storage transistors 40 are not formed directly across each other on the same bit line 17 but rather are offset from each other in the Y-direction. The staggering of the local word line structures 24 in two adjacent gate structure bodies 20 result in the local word line structures being arranged in two groups.

In particular, the memory array includes local word line structures 24o formed in odd rows and local word line structures 24e formed in even rows. The odd and even local word lines are coupled to respective odd and even global word lines, as shown in FIG. 6.

In the present description, references to the local word line 21 refers to the conductive word line layer in the local word line structure for connecting to the global word line. It is understood that the local word line 21 is part of the local word line structure 24 where the charge storage film formed on the local word line 21 together with the local word line forms a storage transistor at every intersection with the unit cell structure.

Figure 6:
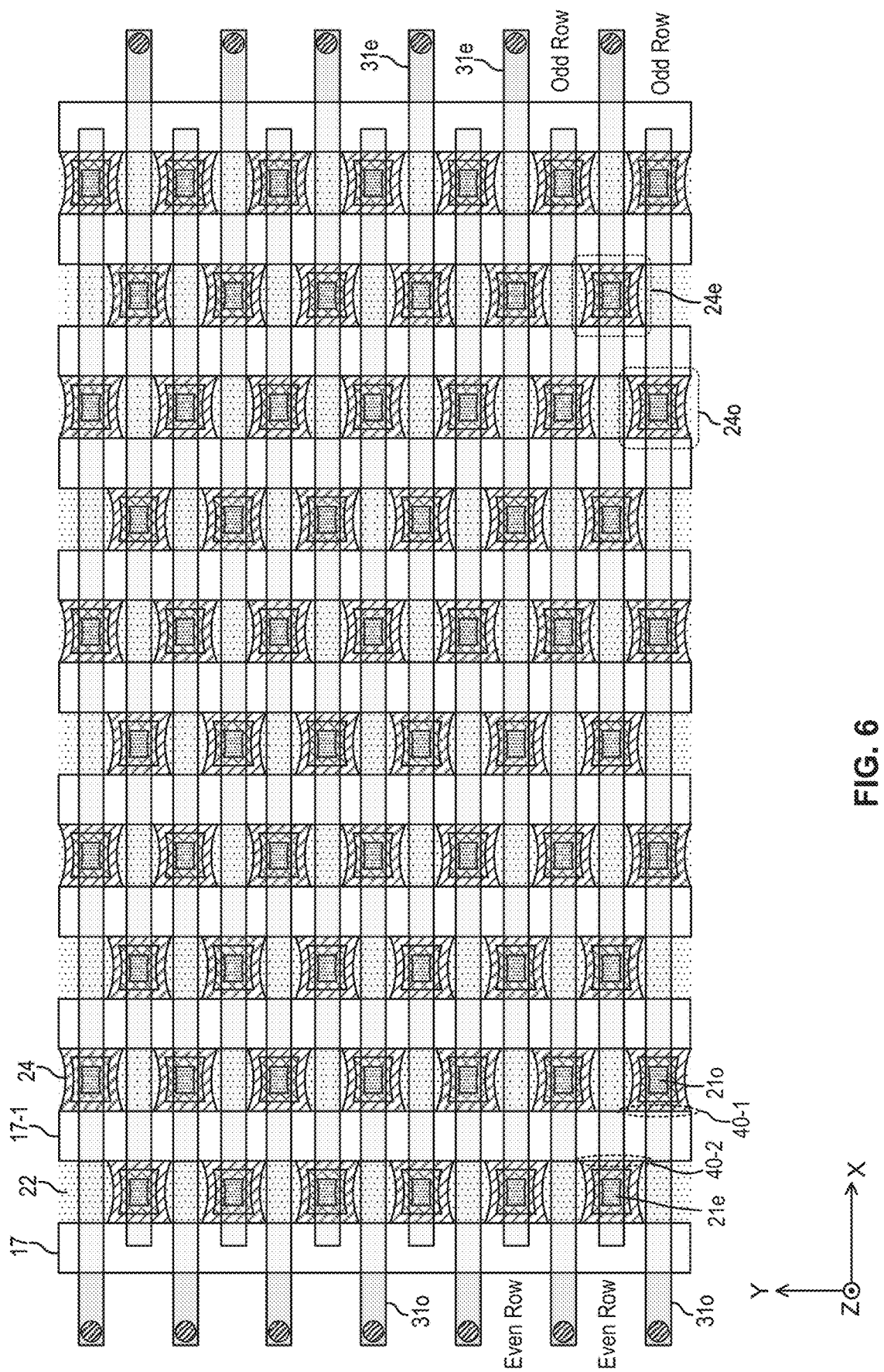
FIG. 6 illustrates the cross-sectional view of the 3-D NOR memory array in the X-Y plane of FIG. 5 including the global word line structure in some embodiments.

FIG. 6 illustrates the cross-sectional view of the 3-D NOR memory array in the X-Y plane of FIG. 5 including the global word line structure in some embodiments. Referring to FIG. 6, global word lines 31 are formed above the 3-D NOR memory array in the Z-direction to the local word lines. With the local word line structures 24 organized in a first group of odd local word lines and even local word lines, the global word lines are also arranged in two groups. A first group of odd global word lines 31o connects to the odd local word lines 21o and a second group of even global word lines 31e connects to the even local word lines 21e.

In a traditional arrangement, the global word lines 31o and 31e extend across the entire memory array in the X direction. That is, each global word line 31 connects to all of the local word lines in the respective row. For each bit line 17, storage transistors 40 are formed on both sides of the bit line and are associated with odd and even local word lines. For example, for a bit line 17-1, a storage transistor 40-1 associated with an odd word line 21o is formed on one side and a storage transistor 40-2 associated with an even word line 21e is form on the other side of the same bit line. As thus configured in the traditional arrangement, one storage transistor on any given bit line will be selected and turned on by a selected word line. This presents a challenge for providing a reference bit line where it is desired that no storage transistor on the reference bit line be selected. In embodiments of the present disclosure, novel global word line layouts are used to implement a reference bit line structure to allow one or more bit lines in the memory array to be used as a reference bit line. In particular, the novel global word line layout patterns provide one or more reference bit lines where the storage transistors associated with the reference bit lines are not turned on irrespective of any word line being activated in the memory array.

Figure 7:
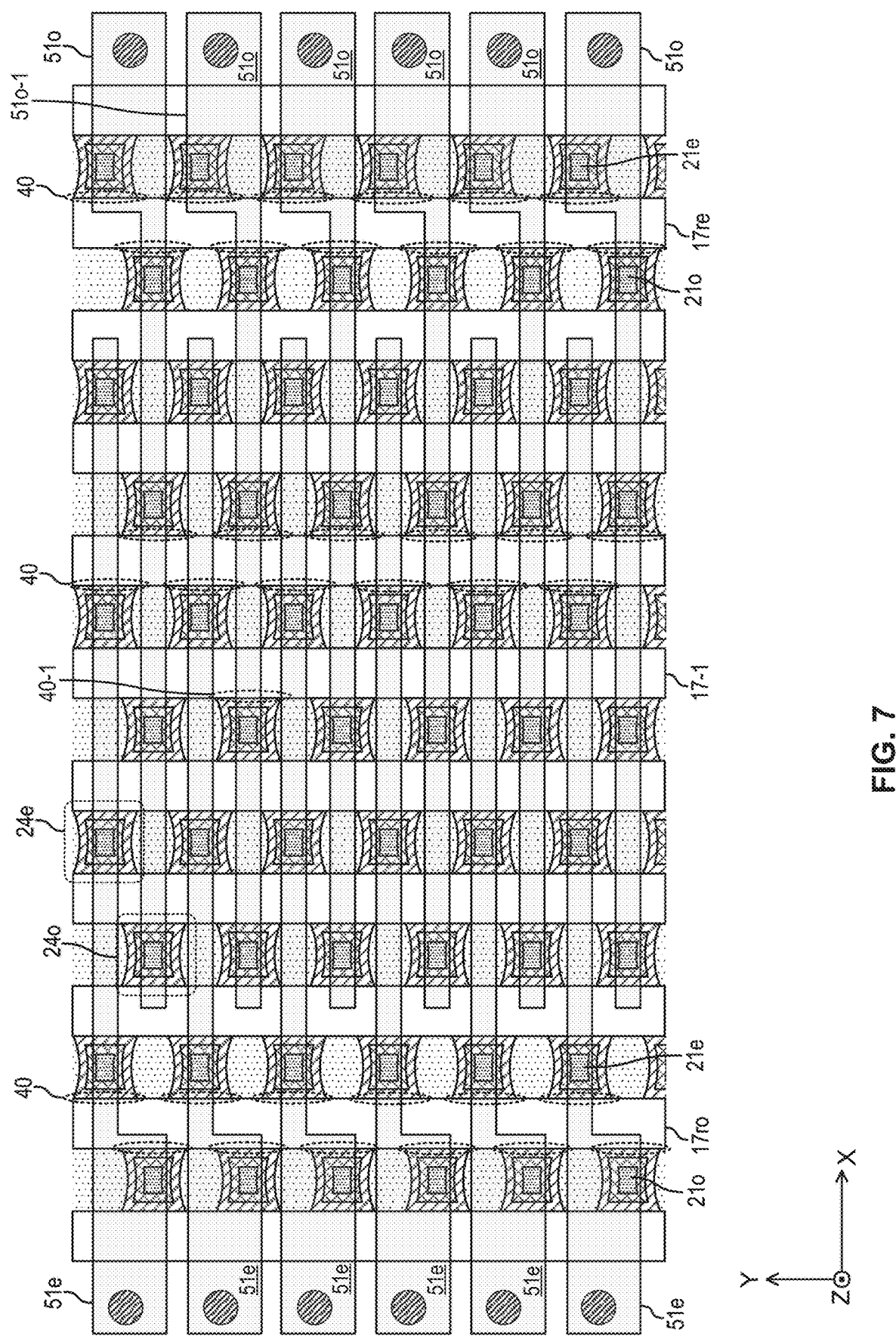
FIG. 7 is a cross-sectional view of a 3-D NOR memory array in the X-Y plane illustrating the global word line layout for implementing the reference bit line structure in embodiments of the present disclosure.

FIG. 7 is a cross-sectional view of a 3-D NOR memory array in the X-Y plane illustrating the global word line layout for implementing the reference bit line structure in embodiments of the present disclosure. Referring to FIG. 7, a semiconductor memory device implements a 3-D NOR memory array as described above. The 3-D NOR memory array is constructed in the same manner as described above with reference to FIG. 5. That is, the 3-D NOR memory array includes alternate source-drain structure bodies 10 and gate structure bodies 20 arranged interleaving in the X-direction. The source-drain structure body 10 includes multiple layers of unit cell structures arranged in the Z-direction, each unit cell structure extending in the Y-direction and isolated from a neighboring unit cell structure in the Z-direction by an insulating layer. The cross-sectional view in FIG. 7 illustrates the bit line 17 formed in the source-drain structure body 10. The gate structure body 20 includes multiple local word line structures 24 arranged in the Y-direction and interleaving with insulating members 22. The local word line structure 24 extends in the Z direction to intersect the multiple layers of unit cell structures to form storage transistors at the intersection thereof.

The 3-D NOR memory array is configured to include local word line structures 24o formed in odd rows and local word line structures 24e formed in even rows. Accordingly, the local word lines include a first group of odd local word lines 21o formed in the odd rows and a second group of even local word lines 21e formed in the even rows. The 3-D NOR memory array also includes a first group of odd global word lines 51o connecting to the odd local word lines 21o and a second group of even global word lines 51e connecting to the even local word lines 21e. However, according to embodiments of the present disclosure, the global word lines 51o and 51e do not extend to all of the local word line structures on the respective odd and even rows. Rather, the global word lines 51o and 51e terminate before the last local word line structure in the respective odd and even rows. Furthermore, the global word lines 51o and 51e are configured to connect to the last local word line in an adjacent odd/even row of the opposite group. In this manner, a pair of reference bit lines 17r are provided which can be used to provide the reference bit line signal to generate the read reference signal for read operation to latch the read out data.

More specifically, with the global word lines 51o and 51e thus configured, a pair of reference bit lines 17r are provided where the storage transistors formed on both side of the respective reference bit line are connected to the same global word line. That is, the storage transistors formed on both side of the reference bit line are associated with local word lines that are connected to the global word lines of the same group. In some embodiments, the reference bit line structure includes a global word line that connects to the local word lines of the same group and to an adjacent local word line of the other group. In this manner, the bit line shared by the local word lines of different groups that are connected to the global word line of the same group can be used as a reference bit line.

Referring still to FIG. 7, the 3-D NOR memory array includes a first reference bit line 17ro and a second reference bit line 17re. In the present embodiment, the odd global word line 51o extends from the reference bit line 17re and through the strings of storage transistors in the odd row and terminates before the reference bit line 17ro. As thus configured, the odd global word line 51o is configured to connect to the odd local word lines 21o on the respective odd row and to the even local word line 21e in an adjacent even row that intersects the reference bit line 17re. Meanwhile, the even global word line 51e extends from the reference bit line 17ro and through the strings of storage transistors in the even row and terminates before the reference bit line 17re.

As thus configured, the even global word line 51e is configured to connect to the even local word lines 21e on the respective even row and to the odd local word line 21o in an adjacent odd row that intersects the reference bit line 17ro. In other words, an odd global word line connects to the local word lines in the odd row and also the local word line in the adjacent even row at the reference bit line 17re. In this manner, the local word lines on both sides of the reference bit line 17re are connected to the odd global word line. On the other hand, an even global word line connects to the local word lines in the even row and also the local word line in the adjacent odd row at the reference bit line 17ro. In this manner, the local word lines on both sides of the reference bit line 17ro are connected to the even global word line.

As thus configured, the reference bit line 17ro has associated storage transistors and local word lines that are all connected to the even global word lines. Meanwhile, the reference bit line 17re has associated storage transistors and local word lines that are all connected to the odd global word lines. In operation, the reference bit line 17ro can be used to provide the reference bit line signal when an odd global word line is selected and the reference bit line 17re can be used to provide the reference bit line signal when an even global word line is selected.

In the read operation, a word line and a bit line are selected to access a storage transistor. In one example, an odd global word line 51o-1 is selected and a bit line 17-1 is selected to access a storage transistor 40-1. In that case, the global word line 51o-1 is driven to the read voltage (e.g., 2V) and all other global word lines are kept at the off voltage (e.g., 0V). Meanwhile, the selected bit line 17-1 as well as the reference bit lines 17ro and 17re are precharged. With global word line 51o-1 selected, all the local word lines 21o in the odd row connected to the global word line 51o-1 are activated. In this manner, the storage transistor 40-1 at the intersection of the global word line 51o-1 and the bit line 17-1 is selected and the stored data can be read out.

Meanwhile, at the reference bit line 17ro, the local word line 21o in the same odd row as the selected global word line 51o-1 is connected to an even global word line 51e. Therefore, even with the odd global word line 51o-1 being activated, no storage transistor on the reference bit line 17ro is selected. The reference bit line 17ro can then be used to provide the reference bit line signal for reading stored data from storage transistor 40-1 on the odd row.

In another example, when a storage transistor on an even row is selected, then the reference bit line 17re is used to provide the reference bit line signal. In particular, when an even global word line 51e is selected, all the local word lines in the even row of the global word line 51e are selected. However, at the reference bit line 17re, the local word line 21e in the same even row as the selected even global word line is connected to an odd global word line 51o. Therefore, even with the even global word line 51e being activated, no storage transistor on the reference bit line 17re is selected. The reference bit line 17re can then be used to provide the reference bit line signal for reading stored data from storage transistor on the even row.

Figure 8:
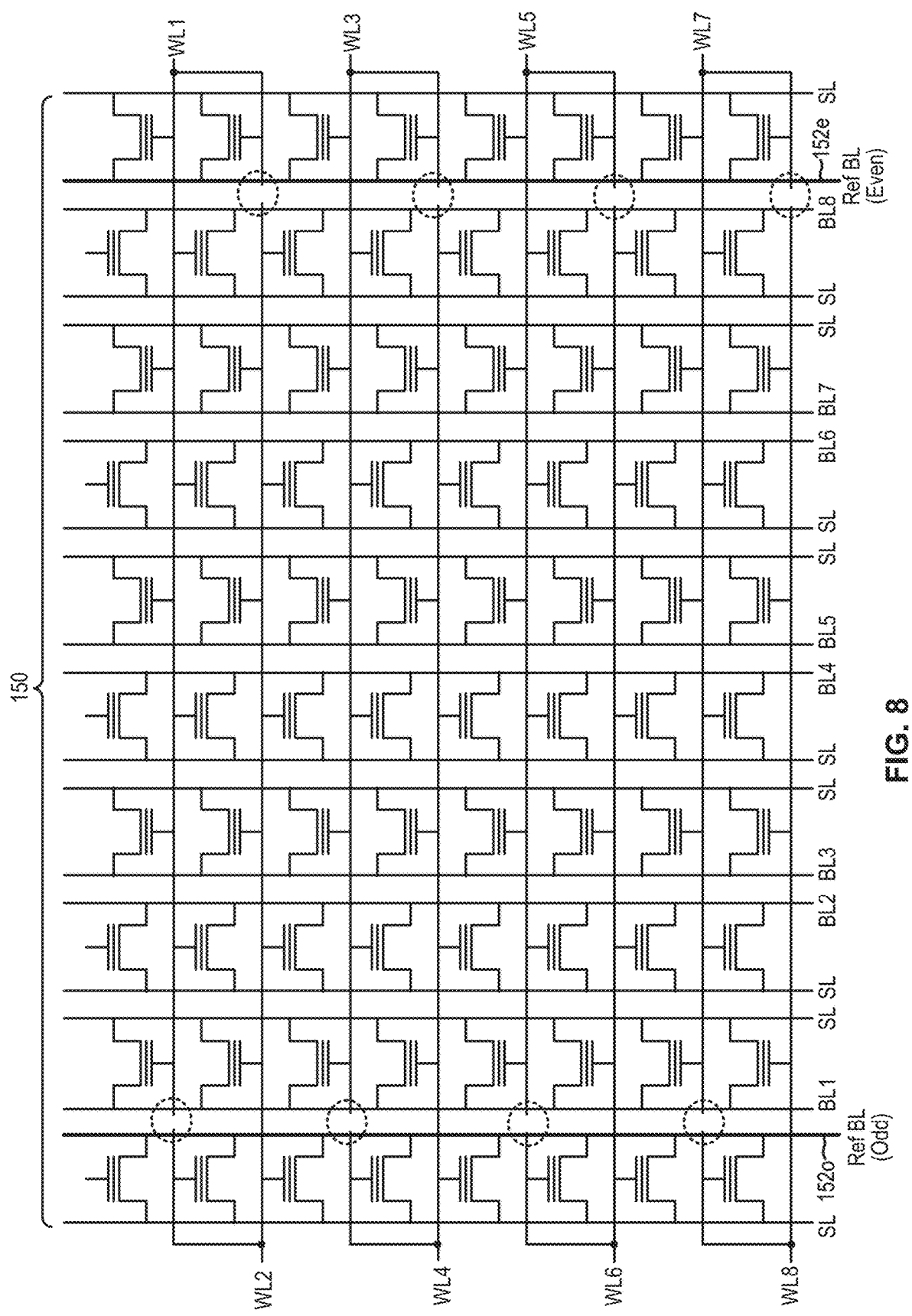
FIG. 8 is a schematic diagram illustrating a memory array and the reference bit line structure in embodiments of the present disclosure.

FIG. 8 is a schematic diagram illustrating a memory array and the reference bit line structure in embodiments of the present disclosure. FIG. 8 illustrates the circuit representation of the reference bit line structure shown in FIG. 7. Referring to FIG. 8, an array 150 of storage transistors is illustrated and represents one layer of the unit cell structures in the 3-D memory array. Reference bit lines 152o and 152e are provided to use for the storage transistors on the odd or even rows in the memory array, associated with odd or even global word lines. Reference bit lines 152o is configured so that all the storage transistors connected thereto are coupled to the even global word lines (e.g., WL2, WL4, etc.). As such, when an odd global word line is selected (e.g., WL1, WL3, etc.), no storage transistor associated with the reference bit line 152o is selected and the reference bit line 152o can be used to provide the reference bit line signal. On the other hand, reference bit lines 152e is configured so that all the storage transistors connected thereto are coupled to the odd global word lines (e.g., WL1, WL3, etc.). As such, when an even global word line is selected (e.g., WL2, WL4, etc.), no storage transistor associated with the reference bit line 152e is selected and the reference bit line 152e can be used to provide the reference bit line signal.

Figure 9:
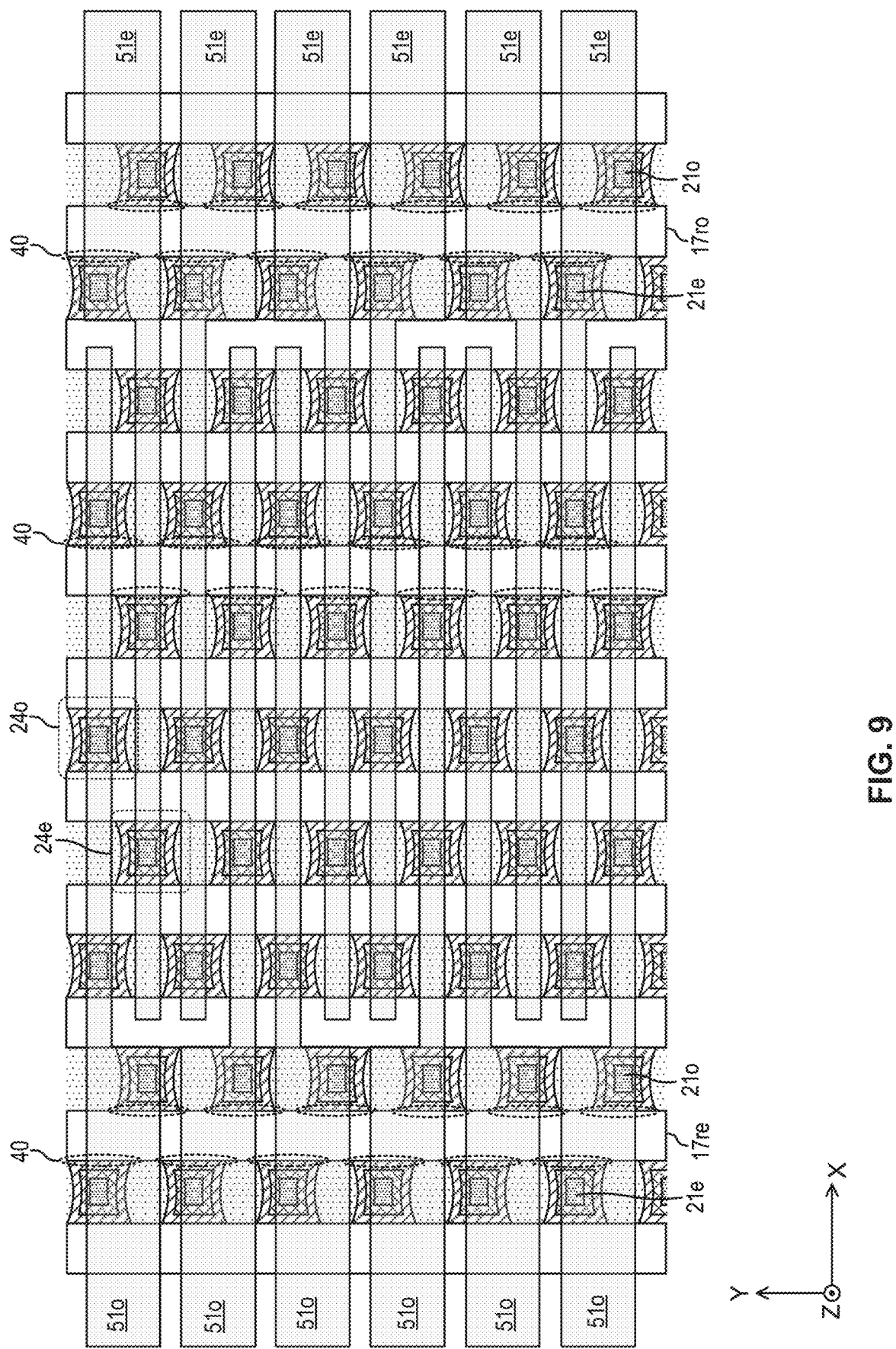
FIG. 9 is a cross-sectional view of a 3-D NOR memory array in the X-Y plane illustrating the global word line layout for implementing the reference bit line structure in alternate embodiments of the present disclosure.

FIG. 9 is a cross-sectional view of a 3-D NOR memory array in the X-Y plane illustrating the global word line layout for implementing the reference bit line structure in alternate embodiments of the present disclosure. FIG. 9 illustrates another layout of the global word lines which can be used to provide the reference bit lines in the same manner as described above with reference to FIG. 7. Referring to FIG. 9, a reference bit line 17re is associated with local word lines on both sides that are connected to the odd global word line 510. Meanwhile, a reference bit line 17ro is associated with local word lines on both sides that are connected to the even global word line 51e. FIG. 9 illustrates different layout patterns that can be used to connect the local word lines on both side of the reference bit line. In practice, other layout patterns can be used to accomplish the reference bit line structure described herein.

In the above described embodiments, the semiconductor memory device is formed using a three-dimensional NOR memory array including multiple layers of memory strings. In other embodiments, the semiconductor memory device may be a two-dimensional NOR memory array including a single layer of memory stings. The reference bit line structure can be implemented in the two-dimensional NOR memory array to provide reference bit lines for read operations, in the same manner as in the 3-D NOR memory array.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A memory device comprising:
    an array of storage transistors including multiple strings of storage transistors arranged in parallel in a first direction with storage transistors formed along a second direction normal to the first direction, the storage transistors in each string comprising drain terminals connected to a bit line and gate terminals connected to a plurality of word lines; and
    the array of storage transistors comprising a first section of strings of storage transistors for storing data, and a first string of storage transistors as a first reference string and a second string of storage transistors as a second reference string,
    wherein the plurality of word lines comprises a first group of word lines and a second group of word lines, and the storage transistors in each string in the first section have gate terminals that are connected alternately to a word line in the first group and a word line in the second group; and
    wherein the storage transistors in the first reference string have gate terminals connected to word lines in the first group and the storage transistors in the second reference string have gate terminals connected to word lines in the second group; and
    wherein the first reference string provides a first reference bit line signal for reading stored data from the storage transistors in the first section that are connected to word lines in the second group and the second reference string provides a second reference bit line signal for reading stored data from the storage transistors in the first section that are connected to word lines in the first group.

2. The memory device of claim 1, wherein the first section of the strings of storage transistors is arranged in a central portion of the array, the first reference string being positioned at a first end of the array in the first direction and the second reference string being positioned at a second end of the array, opposite the first end in the first direction.

3. The memory device of claim 2, wherein the words lines in the first and second groups extend in the first direction and are arranged alternately in the second direction to connect to respective gate terminals of storage transistors in the array, the word lines in the first group extending from the first reference string and through the strings of storage transistors in the first section and terminating before the second reference string, and the word lines in the second group extending from the second reference string and through the strings of storage transistors in the first section and terminating before the first reference string.

4. The memory device of claim 2, wherein in the first section of the strings of storage transistors, the storage transistors in each string are formed on two sides of the bit line and in offset positions, the storage transistors on a first side of the bit line being connected to word lines in the first group and the storage transistors on a second side of the bit line, opposite the first side, being connected to word lines in the second group.

5. The memory device of claim 4, wherein the storage transistors in the first reference string are formed on two sides of the bit line and in offset positions, the storage transistors on the two sides being connected to word lines in the first group; and the storage transistors in the second reference string are formed on two sides of the bit line and in offset positions, the storage transistors on the two sides being connected to word lines in the second group.

6. The memory device of claim 2, wherein the storage transistors in each string are formed on two sides of the bit line and in offset positions, to form storage transistors arranged in alternate rows in the array, a first group of rows interleaving with a second group of rows, and wherein in the first section, the storage transistors in the first group of rows connecting to word lines in the first group and the storage transistors in the second group of rows connecting to word lines in the second group.

7. The memory device of claim 6, wherein in the first reference string, the storage transistors in the first and second groups of rows are connected to the word lines in the first group; and in the second reference string, the storage transistors in the first and second groups of rows are connected to the word lines in the second group.

8. The memory device of claim 1, wherein the array of storage transistors comprises a three-dimensional array of storage transistors, including multiple strings of storage transistors arranged in parallel in a first direction to form a layer of storage transistors and multiple layers of storage transistors stacked in a third direction normal to the first and second directions to form the three-dimensional array of storage transistors; and
wherein the first reference string and the second reference string are provided on each layer of storage transistors.

9. The memory device of claim 8, wherein each word line in the plurality of word lines comprises a global word line connecting to a plurality of local word lines, the global word lines extending in the first direction across the strings of storage transistors and including a first group of global word lines corresponding to the first group of word lines and a second group of global word lines corresponding to the second group of word lines, the global word lines in the first and second groups being arranged alternately in the second direction across the array; and
wherein the local word lines are arranged on both sides of the bit lines and in offset positions to form a first group of local word lines and a second group of local word lines, the first group of local word lines interleaving the second group of local word lines in the second direction, the local word lines extending in the third direction to connect to gate terminals of the storage transistors in the multiple layers.

10. The memory device of claim 9, wherein the first section of the strings of storage transistors is arranged in a central portion of the array, the first reference strings being positioned at a first end of the array in the first direction and the second reference strings being positioned at a second end of the array, opposite the first end in the first direction.

11. The memory device of claim 10, wherein in the first section of the strings of storage transistors, the global word lines in the first group connect to local word lines of the first group and the global word lines in the second group connect to local word lines of the second group; and wherein the local word lines in the first and second group associated with the first reference string are connected to the global word lines of the first group, and the local word lines in the first and second group associated with the second reference string are connected to the global word lines of the second group.

12. The memory device of claim 10, wherein the global word lines in the first group extend in the first direction to connect to the local word lines of the first and second groups associated with the first reference strings and connect to local word lines in the first group in the first section of storage transistors; and the global word lines in the second group extend in the first direction to connect to the local word lines of the first and second groups associated with the second reference strings and connect to local word lines in the second group in the first section of storage transistors.

13. The memory device of claim 12, wherein the global word lines in the first group extend in the first direction from the first end and terminate before the local word lines associated with the second reference strings and the global word lines in the second group extend in the first direction from the second end and terminate before the local word lines associated with the first reference strings.

14. The memory device of claim 12, wherein in the first section of the strings of storage transistors, the storage transistors in each string are formed on two sides of the bit line at the intersection of the bit line and a local word line, the storage transistors on a first side of the bit line being connected to local word lines in the first group and the storage transistors on a second side of the bit line, opposite the first side, being connected to local word lines in the second group.

15. The memory device of claim 14, wherein the storage transistors in the first reference string formed on two sides of the bit line and in offset positions are connected respective local word lines of the first and second group, where both local word lines of the first and second group are connected to a global word line of the first group; and the storage transistors in the second reference string formed on two sides of the bit line and in offset positions are connected respective local word lines of the first and second group, where both local word lines of the first and second group are connected to a global word line of the second group.

16. The memory device of claim 1, wherein the bit lines of the multiple strings of storage transistors are coupled to a plurality of sense amplifiers, each sense amplifier receiving a bit line signal associated with a storage transistor being accessed to read the stored data and generating a sense amplifier output signal indicative of the stored data; and
wherein the first reference string provides the first reference bit line signal on a first reference bit line, the first reference bit line being coupled to a first reference sense amplifier to generate a first read reference signal, the first read reference signal being applied to latch the sense amplifier output signal generated by the sense amplifier connected to a bit line associated with a storage transistor being selected for access, the storage transistor being connected to a word line in the second group.

17. The memory device of claim 16, wherein the second reference string provides the second reference bit line signal on a second reference bit line, the second reference bit line being coupled to a second reference sense amplifier to generate a second read reference signal, the second read reference signal being applied to latch the sense amplifier output signal generated by the sense amplifier connected to a bit line associated with a storage transistor being selected for access, the storage transistor being connected to a word line in the first group.

18. The memory device of claim 1, wherein the first reference string provides the first reference bit line signal on a first reference bit line and the second reference string provides the second reference bit line signal on a second reference bit line, each of the first reference bit line and the second reference bit line having the same electrical characteristics as the bit lines of the multiple strings of storage transistors in the first section.

19. The memory device of claim 18, wherein the first reference string has no storage transistors being selected in response to a storage transistor being selected for access by a word line in the second group, and the second reference string has no storage transistors being selected in response to a storage transistor being selected for access by a word line in the first group.

20. The memory device of claim 19, wherein the first reference bit line signal and the second reference bit line signal each comprises a leakage current flowing in the respective first and second reference bit lines in response to the first and second reference bit lines being activated and no storage transistor being selected for access.

21. The memory device of claim 1, wherein the first section of the strings of storage transistors and the first and second reference strings comprise storage transistors of the same type.

22. The memory device of claim 1, wherein the array of storage transistors comprises charge-trapping type field effect transistors, and wherein the first section of strings of storage transistors and the first and second reference strings both comprise charge-trapping type field effect transistors.

23. The memory device of claim 1, wherein the array of storage transistors comprises ferroelectric field effect transistors, and wherein the first section of strings of storage transistors and the first and second reference strings both comprise ferroelectric field effect transistors.

* * * * *